US006759892B2

(12) United States Patent
Gammie et al.

(10) Patent No.: US 6,759,892 B2
(45) Date of Patent: Jul. 6, 2004

(54) TEMPERATURE COMPENSATION TRIM METHOD

(75) Inventors: David Alexander Gammie, Tucson, AZ (US); Jeffrey B. Parfenchuck, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/188,018

(22) Filed: Jul. 1, 2002

(65) Prior Publication Data

US 2003/0179036 A1 Sep. 25, 2003

Related U.S. Application Data

(60) Provisional application No. 60/367,844, filed on Mar. 25, 2002.

(51) Int. Cl.[7] ......................... H01L 35/00; H01L 37/00; H03K 3/42; H03K 17/78

(52) U.S. Cl. ....................................... 327/512; 327/350

(58) Field of Search ................................ 327/512, 513, 327/350, 351

(56) References Cited

U.S. PATENT DOCUMENTS 6,507,233 B1 * 1/2003 Parfenchuck et al. ....... 327/513

* cited by examiner

*Primary Examiner*—Terry D. Cunningham
*Assistant Examiner*—Quan Tra
(74) *Attorney, Agent, or Firm*—W. Daniel Swayze, Jr.; W. James Brady; Frederick J. Telecky, Jr.

(57) ABSTRACT

The present invention overcomes the disadvantages of the prior art and provides a new temperature compensation trimming technique. Temperature compensated output is provided in a logarithmic voltage output device by the steps of: measuring the resistance of a first resistor, a second resistor, and a third resistor at a first temperature; measuring again the resistances of the first resistor, second resistor, and third resistor at a second temperature; and trimming the drift of the third resistor according to a calculated temperature compensation trim.

21 Claims, 2 Drawing Sheets

TEMPERATURE COMPENSATION TRIM METHOD

CROSS-REFERENCE TO RELATED APPLICATIONS

This application claims the benefit of, and priority to, U.S. Provisional Application Serial No. 60/367,844 filed Mar. 25, 2002, which is hereby incorporated by reference in its entirety.

FIELD OF INVENTION

The present invention generally relates to a logarithmic amplifier circuit. More particularly, the present invention relates to a temperature compensation method for trimming a logarithmic amplifier output.

BACKGROUND OF THE INVENTION

The increasing demand continues for higher performance products, particularly for use in communication and processing applications. With this demand the need for improvements in the components and devices within these products also increases. This need is particularly keen in connection with logarithmic amplifier devices, as are used, for example, to generate an output that is proportional to the logarithm of the ratio of the input currents. Products incorporating logarithmic amplifiers include various devices such as video amplifiers, medical equipment, analytical instruments, radar and infrared devices, data compression devices, and signal processing devices.

It is often desirable that microelectronic devices produce identical results regardless of the temperature at which they operate. Therefore, temperature changes, ideally, would not effect the output of a logarithmic amplifier. However, log amps using bipolar transistors exhibit temperature drift due to the temperature effects of the thermal voltage ("VT"). Therefore, uncorrected, the output of a logarithmic amplifier will drift with temperature. To reduce the effects of this temperature drift, prior temperature drift compensating solutions have trimmed a resistor and thereby created a compensating temperature coefficient ("TC").

For example, prior art temperature compensation techniques trim the temperature coefficient of a second resistor so the reciprocal of its TC will drift in the opposite direction of the VT drift. A typical logarithmic amplifier includes a gain resistor (R1) and a drift trimming resistor (R2). The gain resistor may be trimmed to achieve a desired output gain. However, the VT drifts on the order of, for example, 3300 ppm/° C. Therefore, a resistor is trimmed to theoretically offset the 3300 ppm/° C. drift of the VT. The drift of a device and the residual drift resulting from prior art techniques varies considerably. While present day logarithmic amplifiers are quite accurate, to meet and exceed the likely demand for even higher performance electronic equipment, new temperature compensation trimming techniques are desirable.

SUMMARY OF THE INVENTION

The present invention overcomes the disadvantages of the prior art and provides a new temperature compensation trimming technique. In accordance with an exemplary embodiment of the present invention, temperature compensated output is provided in a logarithmic voltage output device by the steps of: measuring the resistance of a first resistor, a second resistor, and a third resistor at a first temperature; measuring again the resistances of the first resistor, the second resistor, and the third resistor at a second temperature; and trimming the drift of the third resistor according to a calculated temperature compensation trim.

BRIEF DESCRIPTION OF THE DRAWING

A more complete understanding of the present invention may be derived by referring to the detailed description and claims when considered in connection with the Figures, where like reference numbers refer to similar elements throughout the Figures, and:

DETAILED DESCRIPTION OF EXEMPLARY EMBODIMENTS OF THE INVENTION

The present invention may be described herein in terms of various functional components. Such functional components may be realized by any number of hardware or structural components configured to perform any specified functions. For example, the present invention may employ various integrated components, e.g., buffers, voltage and current references, memory components and the like, comprised of various electrical devices, e.g., resistors, transistors, capacitors, diodes or other devices, whose values may be suitably configured for various intended purposes. For purposes of illustration only, exemplary embodiments of the present invention will be described herein in connection with logarithmic amplifiers. Further, it should be noted that while various components may be suitably coupled or connected to other components within exemplary circuits, such connections and couplings can be realized by direct connection between components, or by connection through other components and devices located therebetween.

As discussed above, a need exists for an improved trimming method that addresses the generally increasing demands for highly accurate logarithmic amplifier output trimming. Accordingly, a new method is provided for achieving temperature compensated output in a logarithmic amplifier.

In an exemplary embodiment of the present invention, accurate temperature drift trimming is facilitated by trimming one or more resistors. For example, the combination of a resistor R2 and a resistor R3 provides a device having a resistance with an effective drift that is trimmed to compensate for the drift associated with the TC of a first gain trim resistor and the inherent VT drift of the log cell (transistors Q1 and Q2). For example, two resistors may be configured, in series or in parallel, such that the net resistive effective TC suitably counteracts the drift of the VT and the gain resistor's TC.

In another exemplary embodiment of the present invention, both the second and third resistor may be trimmed. Furthermore, the third resistor may be combined with the second resistor in series or in parallel. It is noted that resistive elements, described herein, may include one or more resistive elements in combination.

Figure 1:
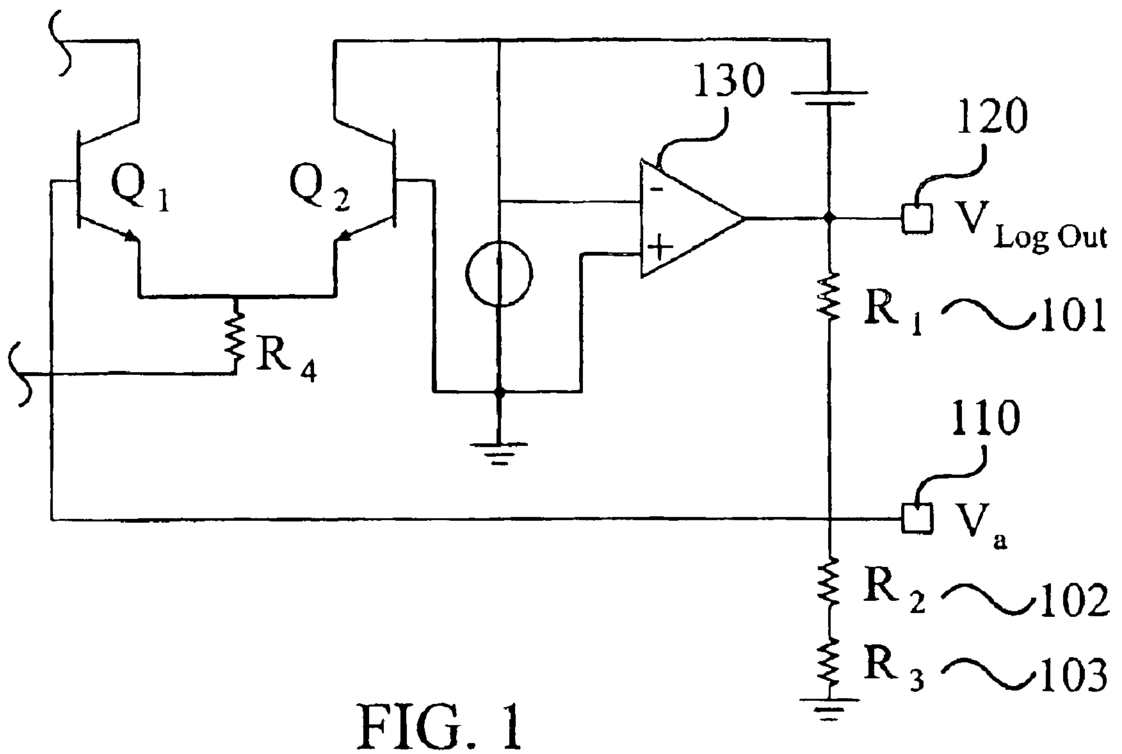
FIG. 1 illustrates an exemplary block diagram of a logarithmic amplifier system in accordance with an exemplary embodiment of the present invention.

In one exemplary embodiment of the present invention, and with reference to FIG. 1, a logarithmic amplifier 100 includes a gain resistor (R1) 101, a bulk compensation resistor (R2) 102, and a trimmable, drift compensating resistor (R3) 103. Logarithmic amplifier 100 may further include matching transistors Q1 and Q2 configured with the emitters connected. In this embodiment, the base of transistor Q1 is connected at an input 110 and between gain resistor R1 and the R2/R3 combination. The base of transistor Q2 is connected to ground. Furthermore, an op amp 130 is configured, for example, to provide an output signal at output 120 that is proportional to the logarithm of the ratio of the input currents, which are the collector currents of Q1 and Q2.

Gain resistor 101 may be trimmed to achieve a desired output gain; however, gain resistor 101 drifts according to the temperature coefficient of gain resistor R1. For example, gain resistor R1 101 may drift 50 ppm/° C. Trimmable resistor 103 is configured in series with resistor 102. However, and with reference to FIG. 2, trimmable resistor 103 may alternatively be configured in parallel with resistor 102. In another exemplary embodiment, both R2 and R3 are capable of being trimmed to a desired value, thereby ratio mixing the combination of R2's TC and R3's TC allows for a more appropriate integrated TC.

In the case where bulk compensation resistor R2 and drift compensating resistor R3 are configured in series, R2 may have a relatively large drift compared to the drift of R3. Furthermore, R3 may be configured such that its resistive value can be trimmed. For example, laser trimming may be used to remove parallel portions of resistor R3. As resistor R3 is trimmed (portions of resistive elements are removed), the resistance of R3 increases thereby making R3 a larger portion of the combination and the combined drift of the R2/R3 series decreases. Thus laser trimming of resistor R3 facilitates precise trimming of temperature drift. In this embodiment, R2 may be a metal resistance, and R3 may comprise a thin film. In an exemplary embodiment of the present invention, R2 is sufficiently greater in magnitude than R3 such that trimming of R3 can suitably change the drift of the R2/R3 combination. The combined R2/R3 resistance is configured to have its reciprocal drift in the opposite direction of the VT drift.

In the case where bulk compensation resistor R2 and drift compensating resistor R3 are configured in parallel, R3 could again be configured such that the drift of the R2/R3 parallel combination can be trimmed. For example, laser trimming is used to remove parallel portions of the resistance of resistor R3. In another example, fusible links could be used to add parallel resistance. As resistor R3 is trimmed, the net contribution of R3 in the R2/R3 parallel configuration decreases, therefore the combined drift of R2/R3 would increase in small amounts. Thus laser trimming of resistor R3 facilitates precise trimming of temperature drift. The reciprocal of the R2/R3 resistance's TC again drifts in the opposite direction of the VT drift. In other embodiments, both bulk compensation resistor R2 and drift compensating resistor R3 can be trimmed or added or both.

In the parallel configuration, the thin film, which has a relatively small TC, would be a relatively large resistor. The metal, in contrast, has a relatively large TC and would be a relatively small resistor. Therefore, the thin film would have less influence and the metal would have a larger influence on the combined overall TC.

In accordance with an exemplary embodiment of the present invention, a temperature compensation method 300 is provided for achieving temperature compensated output in a logarithmic voltage output device. In a first step 310, the resistance of the first, second and third resistor is measured at a first temperature. In a second step 320, the resistance of the first, second, and third resistors is measured at a second temperature. The first and second temperature values may be measured, for example in absolute temperature.

In a third step 330, a compensating third resistor drift is calculated according to a temperature compensation trim calculation process. In one exemplary embodiment of the present invention, the calculation process follows equation 20 and/or the equations used in deriving equation 20. In another embodiment, the temperature compensation trim calculation process follows equation 40 and/or the equations used in deriving equation 40. In these calculation processes two different temperatures, the PPM of the resistors, and the resistance of resistor R2 at the first of the two temperatures is known and the trim of R3 is determined.

Furthermore, any other algorithm that compensates for the change in resistance at two or more temperatures may be used. For example, more than one temperature measuring point may be used. In yet another exemplary embodiment, a linear formula may be generated by taking the derivative of the output with respect to temperature (dVout/dT) and setting the value equal to zero. Then, with some manipulation a resulting function for R3 can be determined and plotted and a linear curve fit can be established.

In a fourth step 340, the third resistor is then trimmed in accordance with the calculated compensating third resistor drift. The trimming of the third resistor may suitably compensate for the temperature drift of the VT and the first resistor.

In other exemplary steps, the first resistor may also be trimmed to adjust the voltage output gain. The first resistor may, however, be trimmed to achieve other objectives.

The drift may be trimmed in a variety of ways. For example, one or more resistors may be selected and configured in parallel and series combination to form a third resistor with a suitable drift. The one or more resistors may be selected from a bank of available resistors, each having different drift TCs. A resistor's TC, and thus its drift, may vary depending on the material used to form the resistor, dimensions of the resistor, and processing mechanisms.

Although residual drift achievable using the above method varies with each circuit, in one exemplary embodiment of the present invention, a residual of 50 ppm/° C. can be achieved. The improved residual may be due to the above described algorithm accounting more completely for the factors involved in temperature drift. For example, the algorithm may account for changes in R1 that are made to trim gain, for the temperature coefficient of R1 and R2, and for the "1" portion of the (1+resistor ratio) equation.

With reference again to FIG. 1, to better understand the operation of method 300, the following equation development and analysis is provided. Assuming that Q1's base current is negligible, that Q1 and Q2 are matched, and that their collector currents are constant, the current through R1 is equal to the current through R2 and R3 giving rise to the equation:

$$I_{R_1} = \frac{v_o - v_a}{R_1} = \frac{v_a}{R_2 + R_3} = I_{R_2+R_3} \tag{1}$$

Equation 1 can be solved for Vo as in equation (2).

$$Vo = Va\left[1 + \frac{R_1}{R_2 + R_3}\right] \tag{2}$$

Va can also be determined through transistors Q1 and Q2 as shown in equation (3).

$$Va = V_{BE_1} - V_{BE_2} \tag{3}$$

Equation (4) represents the relationship between the collector current and saturation current, where $V_T$ is defined by equation (5) and Q=1.6e^−19 C, k is the Boltzmann constant 8.617e^−5 eV/K, and T is in ° K.

$$I_C = I_S e^{V_{BE}/V_T} \text{or } V_{BE} = V_T * \ln\frac{I_C}{I_S} \tag{4}$$

$$V_t = \frac{kT}{Q} \tag{5}$$

Substituting equation (4) into equation (3) yields equation (6).

$$V_a = V_T \ln\frac{I_{C1}}{I_{S1}} - V_T \ln\frac{I_{C2}}{I_{S2}} \tag{6}$$

Given that Q1 and Q2 are matched with identical source currents, equation (6) can be reduced to equation (7).

$$Va = \left[\frac{kT}{Q}\right]\ln\left(\frac{I_{C1}}{I_{C2}}\right) \tag{7}$$

Substituting (7) into (2), yields (8).

$$Vo = \left\{\frac{kT}{Q}\ln\left(\frac{I_{C1}}{I_{C2}}\right)\right\}\left[1 + \frac{R_1}{R_2 + R_3}\right] \tag{8}$$

Because this is a logarithmic amplifier, it is desirable that $$Vo = \log\left(\frac{I_{C1}}{I_{C2}}\right). \tag{9}$$

It is known that $$\frac{\ln(x)}{C_L} \approx \log(x),$$

where $C_L$ is a logarithmic constant that is approximately equal to 2.3 such that the relationship is approximately true. Using this approximation, the logarithmic relationship of equation (9) is substantially achieved if $$\left\{\frac{kT}{Q}\right\}\left[1 + \frac{R_1}{R_2 + R_3}\right] \approx \frac{1}{2.3}. \tag{10}$$

Solving for $$\frac{R_1}{R_2 + R_3},$$

yields $$\frac{R_1}{R_2 + R_3} \approx \frac{Q}{kT * 2.3} - 1.$$

This $$\frac{R_1}{R_2 + R_3}$$

ratio can be evaluated at any suitable temperature. For example, a suitable operating range may be from temperature "a" of 300° K. to temperature "b" of 375° K.

At 300° K., $$\frac{R_{1a}}{R_{2a} + R_{3a}} \approx 15.72. \tag{11}$$

At 375° K., $$\frac{R_{1b}}{R_{2b} + R_{3b}} \approx 12.4. \tag{12}$$

From equation (11), $$R_{1a} \approx 15.72(R_{2a} + R_{3a}). \tag{14}$$

From equation (12), $$R_{3b} \approx \frac{R_{1b}}{12.4} - R_{2b}. \tag{15}$$

Furthermore, a resistance at temperature "b" can be calculated from its resistance at temperature "a" via the relationship $R_{nb}=R_{na}(1+\Delta T^*PPM_{material})$ (16).

PPM of the material is the parts per million per degree Celsius for the metal or the thin film, etc. In one exemplary embodiment of the present invention, R1 and R3 are made of the same material, thin film, and R2 is made of a metal. Using relationship (16) in equation (15) gives rise to equation (17).

$$R_{3a}(1 + \Delta T * PPM_{TF}) \approx \frac{R_{1a}(1 + \Delta T * PPM_{TF})}{12.4} - R_{2b} \tag{17}$$

Rearranging terms and substituting for $R_{2b}$ yields, $$R_{3a} \approx \frac{R_{1a}}{12.4} - \frac{R_{2a}(1 + \Delta T * PPM_{metal})}{(1 + \Delta T * PPM_{TF})} \tag{18}$$

Substituting $R_{1a}$ of equation (14) into equation (18), and rearranging yields $$R_{3a} \approx \left[\frac{1}{\left(\frac{15.72}{12.4}\right) - 1}\right] * \left[\frac{(1 + \Delta T * PPM_{metal})}{(1 + \Delta T * PPM_{TF})} - \frac{15.74}{12.4}\right] * R_{2a} \tag{19}$$

At this point, $R_{2a}$, the PPM of the metal and thin film, and the change in temperature can be determined from measurement. Furthermore, $R_{2a}$ is a fixed value, i.e., one that is not trimmed. Therefore, equation (19) solves for the appropriate trim $R_{3a}$ that suitably trims the logarithmic amplifier between the operating temperatures of 300° K. and 375° K. Following this, R1 may be trimmed to the correct gain value.

Thus, by measuring the resistance of all three resistors at both temperature "a" and "b", and by measuring the temperatures "a" and "b", a suitable trim drift, $R_{3a}$, can be calculated for offsetting the drift. In this embodiment, the variance, corresponding to the temperature change and the associated TC of R1, should suitably be countered by the combinational variance corresponding to the TC's of R2 and R3. In an exemplary embodiment of the present invention, a different material, having a different TC, is used in R2 than in R3 enabling accurate trimming of the combined resistors. This trimming can account for resistance variances due to changes in temperature. R3 may be configured such that a variable resistor can be used for such trimming. In other embodiments, R2 may also be a variable resistor. Furthermore, in general, equation (19) can be written in more general terms where temperatures "a" and "b" are not predetermined.

$$R_{3a} \approx \left[ \frac{1}{\left( \frac{\left\{ \frac{Q}{kT_a * 2.3} - 1 \right\}}{\left\{ \frac{Q}{kT_b * 2.3} - 1 \right\}} \right) - 1} \right] * \left[ \frac{(1 + \Delta T * PPM_{metal})}{(1 + \Delta T * PPM_{TF})} - \frac{\left\{ \frac{Q}{kT_a * 2.3} - 1 \right\}}{\left\{ \frac{Q}{kT_b * 2.3} - 1 \right\}} \right] * R_{2a} \tag{20}$$

Figure 2:
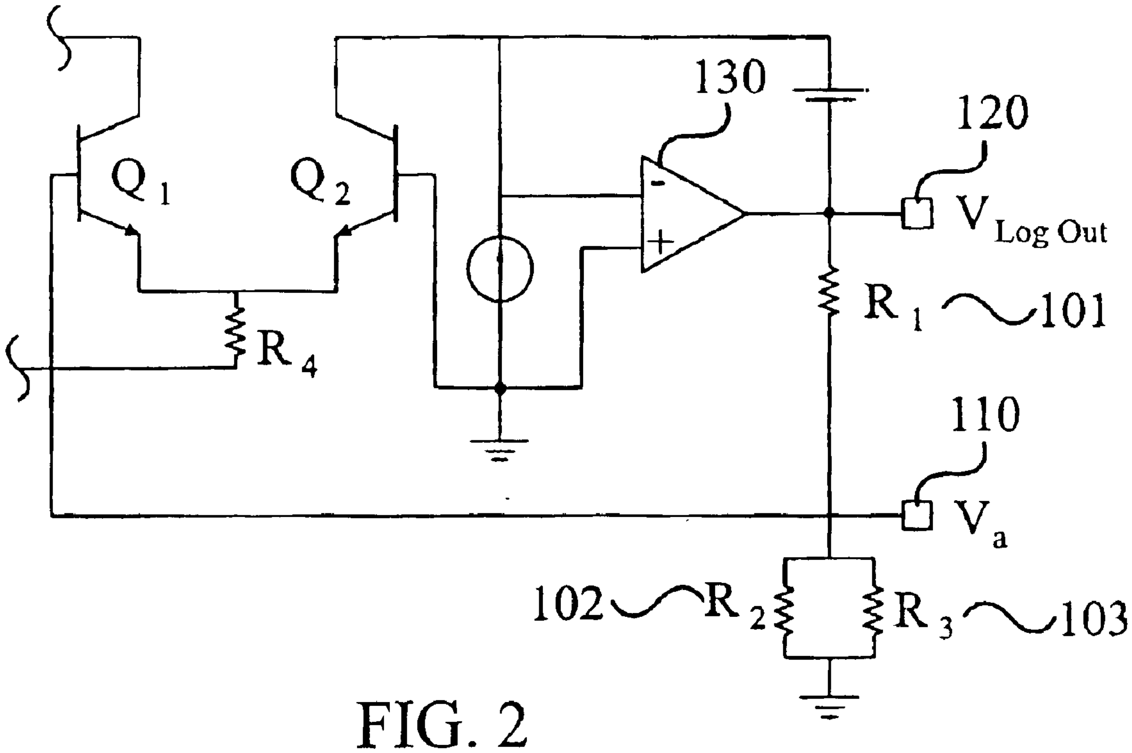
FIG. 2 illustrates an exemplary block diagram of a logarithmic amplifier system in accordance with an exemplary embodiment of the present invention.
Figure 3:
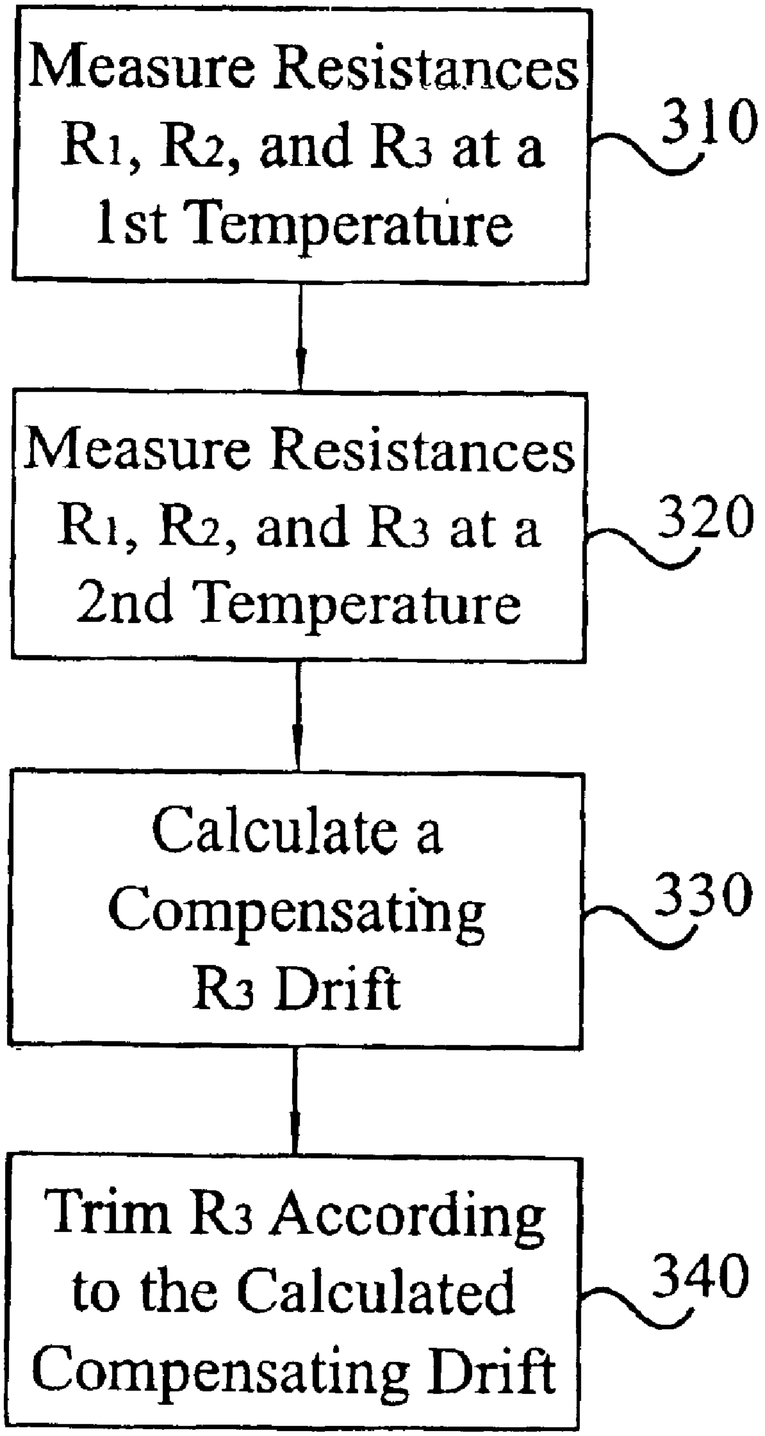
FIG. 3 illustrates an exemplary block diagram of a trimming method in accordance with an exemplary embodiment of the present invention.

Method 300 may be used with other equations and other circuit devices to suitably calculate a drift trim for resistor R3. For example, FIG. 2 illustrates a circuit similar to that of FIG. 1 but having a parallel combination of R2 and R3. This embodiment may have the benefit of saving space in an integrated circuit as a large valued thin film resistor requires less space. Equations 21 through 40 follow the same development for a parallel combination of R2 202 and R3 203 and result in an equation 40 which is solved for a suitable drift trim value, delta R3, for compensating for the drift in R1, R2 and VT.

$$I_{R_1} = \frac{Vo - Va}{R_1} = \frac{Va}{R_2} + \frac{Va}{R_3} = I_{R_2} + I_{R_3} \tag{21}$$

$$V_o = V_a \left[ 1 + \frac{R_1(R_2 + R_3)}{R_2 R_3} \right] \tag{22}$$

$$V_a = V_{BE_1} - V_{BE_2} \tag{23}$$

$$I_C = I_S e^{V_{BE}/V_T} \quad or \quad V_{BE} = V_T \ln \frac{I_C}{I_S} \tag{24) + (25}$$

$$V_a = V_T \ln \frac{I_{C_1}}{I_{S_1}} - V_r \ln \frac{I_{C_2}}{I_{S_2}} \tag{26}$$

$$V_a = \left[ \frac{kT}{Q} \right] \ln \left( \frac{I_{C_1}}{I_{C_2}} \right) \tag{27}$$

$$V_o = \left\{ \frac{kT}{Q} \ln \left( \frac{I_{C_1}}{I_{C_2}} \right) \right\} \left[ 1 + \frac{R_1(R_2 + R_3)}{R_2 R_3} \right] \tag{28}$$

Because this is a logarithmic amplifier, it is desirable that $$Vo = \log \left( \frac{I_{C1}}{I_{C2}} \right). \tag{29}$$

Knowing that $$\frac{\ln(x)}{2.3} \approx \log(x),$$

the logarithmic relationship of equation (29) is substantially achieved if $$\left\{ \frac{kT}{Q} \right\} \left[ 1 + \frac{R_1(R_2 + R_3)}{R_2 R_3} \right] \approx \frac{1}{2.3}. \tag{30}$$

Solving for $$\left[ \frac{R_1(R_2 + R_3)}{R_2 R_3} \right],$$

yields $$\frac{R_1(R_2 + R_3)}{R_2 R_3} \approx \frac{Q}{kT * 2.3} - 1.$$

This $$\left[ \frac{R_1(R_2 + R_3)}{R_2 R_3} \right]$$

ratio can be evaluated at any suitable temperature. For example, a suitable operating range may be from temperature "a" of 300° K. to temperature "b" of 375° K.

At 300° K., $$\frac{R_{1a}(R_{2a} + R_{3a})}{R_{2a} R_{3a}} \approx 15.72. \tag{31}$$

At 375° K., $$\frac{R_{1b}(R_{2b} + R_{3b})}{R_{2b} R_{3b}} \approx 12.4. \tag{32}$$

From equation (31), $$R_{1a} \approx 15.72 \frac{R_{2a} R_{3a}}{(R_{2a} + R_{3a})}. \tag{34}$$

From equation (32), $$R_{3b} \approx \frac{R_{1b}}{\left( 12.4 - \frac{R_{1b}}{R_{2b}} \right)}. \tag{35}$$

Furthermore, a resistance at temperature "b" can be calculated from its resistance at temperature "a" via the relationship $R_{nb} = R_{na}(1 + \Delta T * PPM_{material})$ (36). The PPM of the material may be calculated from the resistance measurements made on the resistors at the first and second temperatures.

Again, one of R2 and R3 may be metal and the other a thin film. In one exemplary embodiment of the present invention, R1 and R3 are made of the same material, thin film, and R2 is made of a metal. Using relationship (36) in equation (35) gives rise to equation (37).

$$R_{3a}(1+\Delta T*PPM_{TF})\approx\frac{R_{1a}(1+\Delta T*PPM_{TF})}{\left(12.4-\frac{R_{1a}(1+\Delta T*PPM_{TF})}{R_{2b}}\right)} \tag{37}$$

Rearranging terms and substituting for $R_{2b}$ yields, $$R_{3a}\approx\frac{R_{1a}}{\left(12.4-\frac{R_{1a}(1+\Delta T*PPM_{TF})}{R_{2a}(1+\Delta T*PPM_{metal})}\right)}. \tag{38}$$

Substituting $R_{1a}$ of equation (34) into equation (38), and rearranging yields $$R_{3a}\approx\left[\frac{15.72}{\left(12.4-\frac{R_{1a}(1+\Delta T*PPM_{TF})}{R_{2a}(1+\Delta T*PPM_{metal})}\right)}-1\right]R_{2a}. \tag{39}$$

Or more generally, $$R_{3a}\approx\left[\frac{\left\{\frac{Q}{kT_a*2.3}-1\right\}}{\left(\left\{\frac{Q}{kT_b*2.3}-1\right\}-\frac{R_{1a}(1+\Delta T*PPM_{TF})}{R_{2a}(1+\Delta T*PPM_{metal})}\right)}-1\right]R_{2a}. \tag{40}$$

The method of the present invention can be adapted to any suitable configuration for achieving a temperature compensated output. In an exemplary embodiment of the present invention, it is possible to achieve a residual 50 ppm/° C. drift. Furthermore, the method described herein may be used in conjunction with a device comprising single or multiple chips and on a single device or multiple devices suitably joined together.

The present invention has been described above with reference to an exemplary embodiment. However, those skilled in the art will recognize that changes and modifications may be made to the exemplary embodiment without departing from the scope of the present invention. For example, the various components may be implemented in alternate ways. These alternatives can be suitably selected depending upon the particular application or in consideration of any number of factors associated with the operation of the system. These and other changes or modifications are intended to be included within the scope of the present invention.

Further, it should be noted that while various components may be suitably coupled or connected to other components within exemplary circuits, such connections and couplings can be realized by direct connection between components, or by connection through other components and devices located there between. However, it should be understood that the following example is for illustration purposes only and that the present invention is not limited to the embodiments disclosed.

What is claimed is:

1. A temperature compensation method for providing temperature compensated output in a logarithmic voltage output device having a first, second, and third resistor, comprising the steps of:

measuring the resistance of said first, second, and third resistor at a first temperature, wherein said first and third resistors comprise thin film resistors and wherein said second resistor comprises a metal resistor;

measuring the resistance of said first, second, and third resistor at a second temperature;

calculating the PPM of said metal and said thin film resistors from said resistance measurements of said first, Second, and third resistor at said first and second temperatures; and trimming said third resistor according to a temperature compensation trim calculation process, wherein the temperature compensation trim calculation process comprises the step of:

calculating a first term wherein said first term is calculated by multiplying the PPM for said metal resistor by the difference between said first and second temperatures and adding one to the result to obtain a numerator, and dividing said numerator by a denominator similarly calculated for the thin film resistor;

subtracting a second term from the first term to obtain a third term, wherein said second term is calculated by dividing the electronic charge by the Boltzmann constant, the first temperature, and a logarithmic constant $C_L$ and then subtracting one from this result to obtain a second numerator, and dividing said second numerator by a second denominator similarly calculated for said second temperature; and multiplying the third term by both a fourth term and the resistance of said second resistor, as measured at said first temperature, to calculate the trim of said third resistor, wherein said fourth term is calculated by subtracting one from said second term and inverting the result.

2. The temperature compensation method of claim 1 further comprising the step of trimming said first resistor to achieve a specified logarithmic voltage output gain.

3. The temperature compensation method of claim 1 wherein the trimming compensates for temperature drift of a logarithmic voltage reference.

4. The temperature compensation method of claim 1 wherein the second resistor is non-trimmable.

5. The temperature compensation method of claim 1 wherein the logarithmic constant $C_L$ is approximately equal to 2.3.

6. A temperature compensation method for providing temperature compensated output in a logarithmic voltage output device having a first, second, and third resistor, comprising the steps of:

measuring the resistance of said first, second, and third resistor at a first temperature, wherein said first and third resistors comprise thin film resistors and wherein said second resistor comprises a metal resistor;

measuring the resistance of said first, second, and third resistor at a second temperature;

calculating the PPM of said metal and said thin film resistors from said resistance measurements of said first, second, and third resistor at said first and second temperatures; and trimming said third resistor according to a temperature compensation trim calculation process, wherein the temperature compensation trim calculation process comprises the step of:

calculating a first term wherein said first term is calculated by dividing the electronic charge by the Boltzmann constant, the first temperature, and a logarithmic constant and then subtracting one from this result;

calculating a second term wherein said second term is calculated by dividing the electronic charge by the Boltzmann constant, the second temperature, and the logarithmic constant and then subtracting one from this result;

calculating a numerator wherein said numerator is calculated by multiplying the PPM for said thin film resistor by the difference between said first and second temperatures and adding one to the result, then multiplying that result by the resistance of said first resistor, as measured at said first temperature;

calculating a denominator wherein said denominator is calculated by multiplying the PPM for said metal resistor by the difference between said first and second temperatures and adding one to the result, then multiplying that result by the resistance of said second resistor, as measured at said first temperature;

calculating a third term wherein said third term is calculated by dividing said numerator by said denominator, calculating a fourth term by dividing said first term by the result of subtracting said third term from said second term; and calculating the trim of said third resistor by subtracting one from said fourth term and multiplying the result by the resistance of said second resistor, as measured at said first temperature.

7. The temperature compensation method of claim 6 further comprising the step of trimming said first resistor to achieve a specified logarithmic voltage output gain.

8. The temperature compensation method of claim 6 wherein the trimming compensates for temperature drift of a logarithmic voltage reference.

9. The temperature compensation method of claim 6 wherein the second resistor is non-trimmable.

10. The temperature compensation method of claim 6 wherein the logarithmic constant is approximately equal to 2.3.

11. A temperature compensation method for providing temperature compensated output in a logarithmic voltage output device having a first, second, and third resistor, comprising the steps of:

measuring the resistance of said first, second, and third resistor at a first temperature;

measuring the resistance of said first, second, and third resistor at a second temperature; and trimming said third resistor according to a temperature compensation trim calculation process.

12. The temperature compensation method of claim 11 wherein the temperature compensation trim calculation process comprises the step of:

calculating a first term whereon said first term is calculated by multiplying the PPM for said metal resistor by the difference between said first and second temperatures and adding one to the result to obtain a numerator, and dividing said numerator by a denominator similarly calculated for the thin film resistor;

subtracting a second term from the first term to obtain a third term, wherein said second term is calculated by dividing the electronic charge by the Boltzmann constant, the first temperature, and a logarithmic constant and then subtracting one from this result to obtain a second numerator, and dividing said second numerator by a second denominator similarly calculated for said second temperature; and multiplying the third term by both a fourth term and the resistance of said second resistor, as measured at said first temperature, to calculate the trim of said third resistor, wherein said fourth term is calculated by subtracting one from said second term and inverting the result.

13. The temperature compensation method of claim 12 wherein said measuring the resistance steps further includes the measuring of said first and third resistors comprising thin film resistors and said second resistor comprises a metal resistor.

14. The temperature compensation method of claim 11 wherein the temperature compensation trim calculation process comprises the step of:

calculating a first term wherein said first term is calculated by dividing the electronic charge by the Boltzmann constant, the first temperature, and a logarithmic constant and then subtracting one from this result;

calculating a second term wherein said second term is calculated by dividing the electronic charge by the Boltzmann constant, the second temperature, and the logarithmic constant and then subtracting one from this result;

calculating a numerator wherein said numerator is calculated by multiplying the PPM for said thin film resistor by the difference between said first and second temperatures and adding one to the result, then multiplying that result by the resistance of said first resistor, as measured at said first temperature;

calculating a denominator wherein said denominator is calculated by multiplying the PPM for said metal resistor by the difference between said first and second temperatures and adding one to the result, then multiplying that result by the resistance of said second resistor, as measured at said first temperature;

calculating a third term wherein said third term is calculated by dividing said numerator by said denominator;

calculating a fourth term by dividing said first term by the result of subtracting said third term from said second term; and calculating the trim of said third resistor by subtracting one from said fourth term and multiplying the result by the resistance of said second resistor, as measured at said first temperature.

15. The temperature compensation method of claim 13 wherein said measuring the resistance steps further includes the measuring of said first and third resistors comprising thin film resistors and said second resistor comprises a metal resistor.

16. The temperature compensation method of claim 12 wherein said logarithmic constant is approximately equal to 2.3.

17. The temperature compensation method of claim 14 wherein said logarithmic constant is approximately equal to 2.3.

18. A temperature compensation method in a logarithmic voltage output device having a first, second, and third resistor comprising the steps of:

measuring the resistance of said first, second, and third resistor, wherein the resistance measuring is performed at a first temperature;

re-measuring the resistance of said first, second, and third resistor, wherein the resistance re-measuring is performed at a second temperature;

calculating a gain trim according to a temperature compensation trim calculation process; and trimming said third resistor according to said calculated temperature compensation trim.

19. A temperature compensation method for providing temperature compensated output in a logarithmic voltage output device comprising a first, second, and third resistor, comprising the steps of:

obtaining a PPM of the first and third resistors, wherein the first and third resistors each comprise a thin film resistor;

obtaining a PPM of the second resistor, wherein the second resistor comprises a metal resistor;

measuring the resistance of the second resistor at a first temperature, selecting a second temperature, wherein said first and second temperature encompass an approximate operating temperature range for the logarithmic voltage output device; and trimming said third resistor according to a temperature compensation trim calculation process, wherein the temperature compensation trim calculation process comprises the step of:

calculating a first term, wherein said first term is calculated by multiplying said PPM for said metal resistor by the difference between said first and second temperatures and adding one to the result to obtain a first numerator, and dividing said first numerator by a first denominator that is similarly calculated for said thin film resistor;

subtracting a second term from said first term to obtain a third term, wherein said second term is calculated by dividing the electronic charge by the Boltzmann constant, the first temperature, and a logarithmic constant and then subtracting one from this result to obtain a second numerator, and dividing said second numerator by a second denominator that is similarly calculated for said second temperature; and multiplying said third term by both a fourth term and the resistance of said second resistor, as measured at said first temperature, to calculate a trim of said third resistor, wherein said fourth term is calculated by subtracting one from said second term and inverting the result.

20. The temperature compensation method of claim 19 wherein said logarithmic constant is approximately equal to 2.3.

21. A system for providing temperature compensated output in a logarithmic voltage output device comprising:

a logarithmic voltage output;

a first resistor connected between said logarithmic voltage output and an applied voltage, wherein said first resistor is configured to have its resistance measured at a first temperature and a second temperature; and a second resistor and a third resistor, connected in series with each other and between said applied voltage and ground, wherein said second and third resistors are configured to have their resistances measured at said first temperature and said second temperature, and wherein said third resistor is configured to be trimmed according to a temperature compensation trim calculation process.

* * * * *